(12) United States Patent
Mercs et al.

(10) Patent No.: US 9,671,137 B2
(45) Date of Patent: Jun. 6, 2017

(54) ABSORBENT MATERIAL AND SOLAR PANEL USING SUCH A MATERIAL

(71) Applicants: VIESSMANN FAULQUEMONT, Faulquemont (FR); CENTRE NATIONAL DE LA RECHERCHE SCIENTIFIQUE, Paris (FR); UNIVERSITE DE LORRAINE, Nancy (FR)

(72) Inventors: David Mercs, Faulquemont (FR); Fabien Capon, Germonville (FR); Alan Corvisier, Tomblaine (FR)

(73) Assignees: VIESSMANN FAULQUEMONT, Faulquemont (FR); CENTRE NATIONAL DE LA RECHERCHE SCIENTIFIQUE, Paris (FR); UNIVERSITE DE LORRAINE, Nancy (FR)

( * ) Notice: Subject to any disclaimer, the term of this patent is extended or adjusted under 35 U.S.C. 154(b) by 0 days.

(21) Appl. No.: 14/776,147

(22) PCT Filed: Mar. 13, 2014

(86) PCT No.: PCT/FR2014/050590
§ 371 (c)(1),
(2) Date: Sep. 14, 2015

(87) PCT Pub. No.: WO2014/140499
PCT Pub. Date: Sep. 18, 2014

(65) Prior Publication Data
US 2016/0033174 A1 Feb. 4, 2016

(30) Foreign Application Priority Data

Mar. 15, 2013 (FR) ...................................... 13 52344

(51) Int. Cl.
*G02B 5/20* (2006.01)
*F24J 2/48* (2006.01)
(Continued)

(52) U.S. Cl.
CPC ........... *F24J 2/487* (2013.01); *C23C 14/0641* (2013.01); *C23C 14/083* (2013.01);
(Continued)

(58) Field of Classification Search
CPC .... F24J 2/4652; F24J 2002/4683; F24J 2/485; G02B 5/0808; G02B 1/11; G02B 5/208;
(Continued)

(56) References Cited

U.S. PATENT DOCUMENTS 7,691,435 B2* 4/2010 Keller ................... C23C 28/042
204/192.1
2009/0253369 A1* 10/2009 Kruzelecky .............. C09K 9/00
455/12.1

FOREIGN PATENT DOCUMENTS

FR WO 2012069718 A1 * 5/2012 ................ C22F 1/00
RU 2061107 C1 * 5/1996
WO 2012069718 A1 5/2012

OTHER PUBLICATIONS

Guinneton et al., "Optimized infrared switching properties in thermochromic vanadium dioxide thin films: role of deposition process and microstructure", Thin Solid Films, Elsevier-Sequoia S.A. Lausanne, CH, vol. 446, No. 2, Jan. 15, 2004, pp. 287-295; in English.
(Continued)

*Primary Examiner* — Mohammed Hasan
*Assistant Examiner* — Rahman Abdur
(74) *Attorney, Agent, or Firm* — Westerman, Hattori, Daniels & Adrian, LLP (57) ABSTRACT

The invention concerns a multilayer material comprising at least:
a support having a reflectance R higher than 80% for radiations of wavelengths higher than 5 μm,
a selective layer comprising a combination of Vanadium oxides $VO_2$ and $VO_2O_{2n+/-1}$, with n>1, said selective
(Continued)

layer having an absorbance higher than 75% for radiations of wavelengths comprised between 0.4 and 2.5 µm, regardless of the temperature T, and having, for radiations of wavelengths comprised between 6 and 10 µm, a transmittance Tr such that:

Tr>85% for T<Tc, a critical temperature,

20%≤Tr≤50% for T>Tc.

Application to the production of thermal solar panels having a low stagnation temperature and high performance.

20 Claims, 2 Drawing Sheets (51) Int. Cl.
| | |
|---|---|
| C23C 14/08 | (2006.01) |
| C23C 28/04 | (2006.01) |
| G02F 1/01 | (2006.01) |
| G02F 1/15 | (2006.01) |
| C23C 14/06 | (2006.01) |
| F24J 2/46 | (2006.01) |
| G02B 1/11 | (2015.01) |
| G02B 5/08 | (2006.01) |

(52) U.S. Cl.
CPC .......... *C23C 28/042* (2013.01); *F24J 2/4652* (2013.01); *F24J 2/485* (2013.01); *G02B 1/11* (2013.01); *G02B 5/0808* (2013.01); *G02B 5/208* (2013.01); *G02F 1/0126* (2013.01); *G02F 1/15* (2013.01); *F24J 2002/4683* (2013.01); *Y02E 10/40* (2013.01)

(58) Field of Classification Search
CPC . C23C 14/0641; C23C 14/083; C23C 28/042; G02F 1/0126; G02F 1/15; Y02E 10/40
USPC ........................................... 359/359
See application file for complete search history.

(56) References Cited

OTHER PUBLICATIONS

International Search Report and Written Opinion of International Search Authority dated Jun. 12, 2014, issued in counterpart Application No. PCT/FR2014/050590; with English partial translation and partial machine translation (21 pages).

Applicant's response and Article 19 PCT amendments dated Aug. 20, 2014, filed in counterpart Application No. PCT/FR2014/050590; with English partial translation and partial machine translation (25 pages).

Written Opinion of International Preliminary Examination Authority dated Feb. 20, 2015, issued in counterpart Application No. PCT/FR2014/050590; with English partial translation and partial machine translation (12 pages).

Applicant's response and Article 34 PCT amendments dated Apr. 9, 2015, filed in counterpart Application No. PCT/FR2014/050590; with English partial translation and partial machine translation (24 pages).

* cited by examiner

ABSORBENT MATERIAL AND SOLAR PANEL USING SUCH A MATERIAL

DEFINITIONS

Any body at temperature T subjected to an electromagnetic radiation having a wavelength $\lambda$, and an incident energy $E(\lambda, T)$ transmits, absorbs or reflects a portion thereof according to the following equation (1):

$$E(\lambda,T)=Et(\lambda,T)+Ea(\lambda,T)+Er(\lambda,T)=\tau\cdot E(\lambda,T)+\alpha\cdot E(\lambda,T)+\rho\cdot E(\lambda,T) \quad (1)$$

where $\tau$, $\alpha$, $\rho$ are, respectively, the transmission, absorption, and reflection coefficients of the material. These coefficients are also called transmittance, absorbance and reflectance. The principle of conservation of the total incident energy makes it possible to relate these coefficients with one another according to the equation: $\tau+\alpha+\rho=1$. In the case where the body under consideration is opaque to incident radiation ($\tau=0$), its absorbance is complementary to its reflectance ($\alpha=1-\rho$).

The emissivity of a material corresponds to its ability to emit radiation as compared to a black body, which absorbs all the energy it receives and radiates all the energy it absorbs to maintain its thermal equilibrium (emissivity $\epsilon=1$), when placed in the same conditions of temperature and wavelength. Kirchhoff's law states that at the thermal equilibrium (constant temperature) and for a given wavelength, the emissivity ($\epsilon$) is equal to the absorbance. Thus, for a given wavelength, the emissivity can be defined as follows: $\epsilon=1-\tau-\rho$ and in the case of an opaque body: $\epsilon=1-\rho$.

Refraction is a phenomenon of deviation of an electromagnetic wave when its speed of propagation changes between two media, and generally occurs at the interface between these two media. In the general case of absorbent or metallic materials, the refractive index is defined by a complex number in order to account for the attenuation of waves in the medium. The refractive index is then noted $N=n+i\cdot k$, where n and k are the optical index and the extinction or attenuation coefficient, respectively. The optical index n is defined as the ratio between the speed of light in a vacuum and the wave propagation speed in the medium under consideration. In the case of a non-absorbent medium k=0 (no interaction between the wave and the medium), the refractive index is equal to the optical index n. The reflection coefficient of electromagnetic radiation at the interface between two media depends on the refractive index of these two media. In a simplified manner, for normal incidence, the reflectance at the interface between media 1 and 2, the radiation going from 1 to 2, can be expressed as follows:

$$\rho_{1-2}=[(n_2-n_1)^2+(k_2-k_1)^2]/[(n_2+n_1)_2+(k_2+k_1)^2] \quad (2)$$

TECHNICAL FIELD AND STATE OF THE ART

The invention relates to a novel absorbent material having specific infrared reflectance characteristics. The invention is applicable in particular to the manufacture of solar panels, and in particular of thermal solar panels.

The patent application WO2012069718 describes well the issues encountered with absorbent materials for solar panels, which is summarized here.

To achieve an effective thermal solar panel, a material is desired that has maximum absorption (>90%) in the visible and near infrared (wavelengths of $0.4<\lambda2.5$ µm) and minimal infrared emissivity (<10%) for wavelengths $\lambda$ typically comprised between 6 and 10 µm, in order to absorb maximum solar energy while limiting as much as possible energy losses by thermal radiation when the panel is hot. When the thermal solar panel is operating normally, the solar energy is converted into heat which is discharged via a heat transfer fluid to heat water from a reservoir, for example, using a heat exchanger. As long as the heat transfer fluid circulates in the panel, in the vicinity of the solar absorber, the heat of the panel is evacuated and its temperature remains below 100-120° C.

However, when the circulation of the heat transfer fluid is stopped, for example, when the water in the tank has reached a desired temperature, the heat transfer fluid is stationary and no longer discharges the energy stored by the panel, while the panel is still subject to solar radiation; the temperature of the panel rises in this case up to an equilibrium temperature called stagnation temperature which may reach 220 to 250° C. for sunshine of 1000 W/m². Such a high stagnation temperature results in rapid degradation of the heat transfer fluid which must be renewed frequently; such stagnation temperature also requires the use of high-performance building material for the production of the panel, and the setting up of hydraulic systems to manage overpressures (expansion tank).

To reduce the stagnation temperature in the panel, the document WO2012069718 proposes in particular:

the use of a layer with a material having a surface morphology that is variable as a function of the temperature to limit the absorbance of the material for temperatures higher than a threshold temperature, or the combination of a layer with a material having a variable surface morphology and an absorbent layer in a thermochromic material whose transmittance Tr in the infrared (wavelengths greater than 3 µm) is:
  higher than a first transmission threshold Tr1 when the temperature T of the thermochromic material is lower than a critical temperature Tc, and
  lower than a second transmission threshold Tr2 when the temperature T° of the thermochromic material is higher than the critical temperature Tc, the second transmission threshold being lower than the first transmission threshold.

For example, the document WO2012069718 proposes producing an absorbent layer in vanadium oxide $VO_2$ having a relatively large absorbance in the visible and near infrared (0.3 to 1.8 µm), in the order of 70 to 80%, and having an infrared transmittance Tr that is variable, in a reversible manner, as a function of the temperature:

at low temperature (T<Tc), the transmittance Tr is in the order of 90 to 100%, at high temperature (T>Tc), the transmittance Tr decreases sharply to reach 5 to 15%.

With a transmittance of less than 15%, the absorbent layer is thus quasi opaque to infrared radiation at T>Tc, and its emissivity is in the order of 30 to 40%, resulting in a lower stagnation temperature than a material not comprising the thermochromic layer would have.

In practice, the production of panels provided with a layer having a variable surface morphology is rather complex on an industrial scale. And experience shows that the use of a single layer of $VO_2$ alone, without a layer of a material having a variable surface morphology, reduces the stagnation temperature of the material, but not sufficiently to limit degradation of a heat transfer fluid flowing in the vicinity of the panel or to enable the use of less expensive materials for producing the support and the frame of the panel.

DESCRIPTION OF THE INVENTION

The invention provides a novel multilayer material having a low stagnation temperature, and a solar panel comprising such a multilayer material. More specifically, the invention provides a novel multilayer material comprising at least:

a support having a reflectance R higher than 80% for radiations of wavelengths higher than 5 μm, a selective layer comprising a combination of Vanadium oxides $VO_2$ and $V_nO_{2n+/-1}$, with n>1, said selective layer having a solar absorbance higher than 75% for radiations of wavelengths comprised between 0.4 and 2.5 μm regardless of the temperature T and having, for radiations having wavelengths comprised between 6 and 10 μm, a transmittance Tr such that:

Tr>85% for T<Tc, a critical temperature,

20%=<Tr=<50% for T>Tc.

Tests show that a layer of pure $VO_2$ has an infrared (6-10 μm) transmittance at T>Tc lower than 10% and is thus virtually opaque. For T>Tc, for infrared radiations (6-10 μm), the selective layer according to the invention is characterized by a partial infrared transmittance Tr comprised between 20 and 50%, and is thus partially transparent.

The partial infrared transmittance (6-10 μm) of the selective layer of the invention, at T>Tc, results in an extinction coefficient k2 in the infrared that is significantly lower than an extinction coefficient k2' of a layer of pure $VO_2$ of the same thickness and placed in the same conditions. Preferably, the selective layer of the invention has an extinction coefficient k2<4.

1) Behavior of the Selective Layer of the Invention at T>Tc as Compared to a Layer of Pure $VO_2$ Experience has shown that a layer of pure $VO_2$, properly crystallized and thick enough to have a absorbance higher than 75% for radiations of wavelengths between 0.3 and 2.5 μm, cannot have an infrared transmittance Tr higher than 10% at T>Tc, taking into account a high extinction coefficient k2', in the order of 7. A thick layer of pure $VO_2$ is thus opaque to infrared radiation (λ between 6 and 10 μm for T>Tc.

In contrast, in the scope of the invention, experience shows that by using for the selective layer a material that is partially transparent to infrared (infrared transmittance Tr of between 20% and 50%, with a low extinction coefficient k2) for T>Tc, a multilayer material is obtained that has a lower infrared reflectance (and thus a higher emissivity) for wavelengths in the infrared range (6-10 μm) than the infrared reflectance of another multilayer material comprising a selective layer of pure $VO_2$, resulting in a stagnation temperature less that the stagnation temperature of another multilayer material comprising a selective layer of pure $VO_2$.

At T>Tc, experience also shows, through transmission and reflection measurements by Fourrier transform infrared spectrometry (FTIR) of the selective layer according to the invention deposited on a silicon substrate, that the increase in infrared transmittance of the selective layer according to the invention is offset by an equivalent decrease in the value of its infrared reflectance (ΔTr=−ΔR). The selective layer according to the invention thus reflects infrared radiations less than a layer of pure $VO_2$ placed in the same conditions, while maintaining an equivalent infrared absorption at 8 μm, so that the relation (1) is always verified (τ+α+ρ=1). As an example, Table I below compares a layer of pure VO2 and a layer of $VO_2/VO_4O_9$ of the same 200 μm thickness; it is immediately observed that ΔTr=Tr−Tr'=0.2=−(R−R')=−ΔR.

TABLE I

Comparison of experimental values of absorbance, transmittance and reflectance of a layer of pure $VO_2$ and of a selective layer according to the invention, having the same thickness (200 μm), for a radiation at a wavelength of 8 μm.

| λ = 8 μm | Layer of pure $VO_2$ at T > Tc | Selective layer according to the invention ($VO_2/VO_4O_9$) at T > Tc |
|---|---|---|
| Transmittance (Tr) | Tr' = 0.10 | Tr = 0.30 |
| Reflectance (R) | R' = 0.55 | R = 0.35 |
| Absorbance (A) | A' = 1 − Tr'− R' = 0.35 | A = 1 − Tr − R = 0.35 |

Thus, at T>Tc, infrared radiation having a wavelength between 6 and 10 μm incident to the multilayer material according to the invention is therefore:

1. less reflected than a layer of pure $VO_2$ of the same thickness (200 μm in the above-mentioned example),
2. partially absorbed by the selective layer with an absorbance equivalent to that of a layer of pure $VO_2$ of the same thickness,
3. partially transmitted (20 to 50%) by the selective layer until the interface between the selective layer and the support,
4. reflected almost entirely (>80%) by the support, a good reflector of infrareds,
5. and partially re-transmitted, and thus, partially reabsorbed, by the selective layer according to the invention before continuing its progress towards the outside of the multilayer material.

In these conditions, and given the constant absorbance of the selective layer according to the invention, the increase in the path of infrared radiation in the selective layer makes it possible to increase the absorbed fraction of the incident infrared radiation, as compared to a layer of pure $VO_2$ of the same thickness. At T>Tc, infrared emissivity of the multilayer material according to the invention, at the wavelength of the incident radiation, is therefore greater than a multilayer material with a selective layer of pure $VO_2$. A thermal solar panel with a multilayer material according to the invention therefore has a maximum operating (stagnation) temperature lower than that of a thermal solar panel whose selective layer consists only of pure $VO_2$.

In a multilayer material according to the invention, for radiations of wavelengths between 6 and 10 μm, if the support has an optical index n1, the selective layer preferably has an optical index n2 such that:

n2<n1 regardless of the temperature T, and n2<6 for T>Tc.

Thus, the infrared reflectance at T>Tc is further reduced, in particular for wavelengths close to 7 to 8 μm. The best results are obtained with an optical index n2 comprised between $0.8*(n1)^{1/2}$ and $1.2*(n1)^{1/2}$ for T>Tc. With such optical indices n1, n2, and especially with an index n2 close to the square root of n1, experience shows that the infrared radiation partially transmitted through the selective layer is reflected by the support, good reflector of infrareds (R>80%), in a manner such that it creates a phenomenon of destructive interference with the radiation reflected at the surface of the selective layer, and this creates an antireflection effect at the surface of the selective layer and thus further reduces the reflectance of the selective layer for a given wavelength, and in particular for a wavelength close to 7 to 8 μm.

Preferably, the support has a high optical index n1 to allow more flexibility in the choice of the value of the optical index n2 of the selective layer. For example, if the support, good reflector of infrareds, is in pure aluminum (infrared reflectance R>95%), n1 is around 16 in the infrared range and the selective layer according to the invention should have an optical index n2 lower than 16 and as close as possible to 4 to maximize the antireflection effect in the infrared range at the interface between the selective layer and the support.

2) Behavior at T<Tc of the Selective Layer According to the Invention, as Compared to a Layer of Pure $VO_2$ As described above, a multilayer material according to the invention comprises at least:

a support having a reflectance R higher than 80% for radiations of wavelengths greater than 5 μm, a selective layer comprising a combination of Vanadium oxides $VO_2$ and $V_nO_{2n+/-1}$, with n>1, said selected layer having a solar absorbance higher than 75% for radiations of wavelengths comprised between 0.4 and 2.5 μm regardless of the temperature T, and having, for radiations of wavelengths comprised between 6 and 10 μm, a transmittance Tr such that:

Tr>85% for T<Tc, a critical temperature,

20%=<Tr=<50% for T>Tc.

Thus, for T<Tc, with a solar absorbance higher than 75% for radiations of wavelengths between 0.4 and 2.5 μm, the selective layer according to the invention absorbs a maximum of solar energy. Also, with a selective layer whose infrared transmittance Tr is higher than 85%, infrared reflectance of the multilayer material according to the invention depends essentially on the high infrared reflectance of the support. This results in limited losses by thermal radiation. Such a multilayer material thus makes it possible to produce a solar cell having a good performance, at least as long as the critical temperature Tc is not reached.

At T<Tc, with Tr>85%, the selective layer is highly transparent to infrared radiations, which corresponds to an extinction coefficient k2 close to 0.

Preferably, at T<Tc, the selective layer according to the invention has an optical index n2 lower than 2.5 for wavelengths in the vicinity of 8 μm. According to the document U.S. Pat. No. 7,691,435 B2 and to the article by F. Guinneton et al./Thin Solid Films 446 (2004) 287-295, a layer of pure $VO_2$ at low temperature is characterized by an optical index between 2.5 and 3 for radiations whose wavelengths are close to 8 μm. In these conditions, and according to the equation (2), the reflectance at the interface between the selective layer according to the invention and the support, good reflector of infrareds, is greater □ρ=94% considering an aluminum support) than at the interface between a layer of pure $VO_2$ and the same support □ρ=91%). Thus, the multilayer material according to the invention also has an infrared emissivity at low temperature □~□6%) lower than a pure $VO_2$-based material □~9%), which results in a better performance at low temperature for a thermal solar panel using a multilayer material according to the invention.

3) Production and Properties of the Selective Layer According to the Invention

Among the multilayer materials according to the invention comprising a selective layer made of a combination of Vanadium oxides of the form $VO_2/V_nO_{2n+/-1}$, with n>1, combinations of oxides of the form $VO_2/V_4O_9$ and $VO_2/V_6O_{13}$ gave the best results.

The proportion of the phase $V_nO_{2n+/-1}$ in the combination of oxides $VO_2/V_nO_{2n+/-1}$ makes it possible in particular to modulate the value of the extinction coefficient k2 and the value of infrared transmittance Tr of the selective layer at T>Tc: the greater this proportion, the greater the decrease of k2 at T>Tc (relative to the extinction coefficient of a layer of pure $VO_2$ of the same thickness).

A two-phase layer of $VO_2$ and $V_nO_{2n+/-1}$ can be prepared by magnetron sputtering in reactive condition from a metallic target of vanadium, with or without ex-situ annealing crystallization, or by an oxidation process of thin coats of vanadium, or by a sol-gel type process, or by any other process making it possible to form a vanadium oxide coating which is at a minimum two-phase, crystallized, and of controlled composition. In the case of magnetron sputtering in reactive condition, forming a $VO_2/V_nO_{2n+/-1}$ layer depends mainly on the precise control of the partial pressure of oxygen in the reactor, via the flow rate of introduced oxygen ($DO_2$), the other deposition parameters being constant; the process requires generally the implementation of an optical system for closed-loop control of the process (Optical Emission Spectroscopy).

For example, two selective layers $VO_2/V_4O_9$ according to the invention, having two different proportions of the $V_4O_9$ phase, can be synthesized with the deposition parameters set forth in Table II below. The conditions for development of a layer of pure $VO_2$ in the same reactor are recalled for comparison.

TABLE II

Main deposition parameters for the formation by reactive magnetron sputtering in reactive condition of a layer of pure $VO_2$ and two selective layers $VO_2/V_4O_9$ according to the invention.

|  | pure $VO_2$ | $VO_2/V_4O_9$ #1 | $VO_2/V_4O_9$ #2 |
| --- | --- | --- | --- |
| $DO_2/(DO_2/D_{Ar})$ | 0.09 | .0909 | 0.092 |
| P (W) | 330 | 330 | 330 |
| Pr(Pa) | 1.2 | 1.2 | 1.2 |

With: $DO_2$ flow rate of oxygen introduced into the reactor $D_{Ar}$ flow rate of argon introduced into the reactor P power dissipated on the pure vanadium target Pr total pressure in the reactor In the case of an oxidation process under controlled atmosphere of a thin layer of pure vanadium, obtaining a two-phase layer $VO_2/V_nO_{2n+/-1}$ depends mainly on the initial thickness of the vanadium layer, the partial pressure of oxygen present in the reactor, the duration, and the temperature of the oxidation process. It has also been shown experimentally that the initial density and the internal constraints of the vanadium layer were a parameter influencing the kinetics of oxidation.

The selective layer according to the invention preferably has a minimum thickness of 100 nm in order to ensure a 75% absorbance at a minimum for radiations whose wavelengths are comprised between 0.4 and 2.5 μm. The selective layer according to the invention preferably has a maximum thickness of 500 nm, so as not to cause an infrared emissivity for wavelengths between 7 and 8 μm higher than 15% at T<Tc. That is, even if the extinction coefficient k2 of the selective layer according to the invention is very close to zero for T<Tc, it is not zero, and the greater the thickness of the selective layer, the more incident infrared radiation is absorbed and the more infrared emissivity is increased (due to the increase in the path of the radiation within the layer). Thus, the absorbent layer preferably has a thickness comprised between 100 and 500 nm.

The thickness of the selective layer can be adjusted so as to increase the antireflection effect of the selective layer on the support, good reflector of infrareds.

4) Variants, Improvements

The selective layer according to the invention can be doped with at least one metal M different from Vanadium, M being for example aluminum, chromium or titanium. Thus, some vanadium atoms of the vanadium oxides formed ($VO_2/V_nO_{2n+/-1}$) are substituted by atoms of the doping metal M. Through the choice of the metal M and its concentration, it becomes possible to adjust the critical temperature Tc of the material at a desired value; for example, a selective layer doped with aluminum has a critical temperature comprised between 80 and 120° C.

Doping with several metals M1, M2, . . . can also be envisioned, possibly with different concentrations for each metal. This allows in particular a finer adjustment of the critical temperature to a desired value.

Such doping can be performed during the development of a selective layer $VO_2/V_nO_{2n+/-1}$ according to the invention on an aluminum support using an oxidation process of a vanadium $VO_2$ layer in the presence of a certain proportion of oxygen: to perform this doping, the processing temperature can be adapted in order to promote the diffusion in the solid state of aluminum atoms of the support into the $VO_2/V_nO_{2n+/-1}$ layer during oxidation (auto-doping phenomenon). Experience shows that such an oxidation process performed at 550° C. makes it possible to increase the critical temperature Tc of the selective layer $VO_2/V_nO_{2n+/-1}$ beyond 80° C. with a variation of the infrared emissivity as a function of the temperature higher than 25%.

A material according to the invention with a critical temperature higher than 80° C. makes it possible, in addition to reducing the stagnation temperature by at least 30° C., to produce a solar panel having a better performance at low temperature (T<Tc) than a solar panel using a selective layer of pure $VO_2$. That is, the closer the critical temperature to the average operating temperature of a conventional absorber (100-120° C.), the higher the performance of a solar panel using a material according to the invention, taking into account the use of a maximum of solar energy before the transformation of the selective layer according to the invention.

According to a variant, the selective layer according to the invention has a concentration in dopant M sufficient to form at least one oxide in the form $M_{1-x}O_x$, with $0<x<1$, x being the atomic fraction of oxygen in the oxide, so that the selective layer comprises a combination of oxides of the type $VO_2$, $V_nO_{2n+/-1}$ and $M_{1-x}O_x$. That is, when the concentration in dopant M is sufficient, higher than a critical dopant concentration, the substitution mechanism of the vanadium atoms formed ($VO_2/V_nO_{2n+/-1}$) is replaced by the formation of an oxide of the metal M used for the doping. In these conditions, the selective layer according to the invention comprises a combination of oxides of the type $VO_2$, $V_nO_{2n+/-1}$ and of the form $M_{1-x}O_x$, M being the metal used for the doping. As previously, doping with several metals M1, M2, . . . can be envisioned to obtain at least an oxide of at least one of the metals M1, M2, . . . ; also, a combination of several metal M oxides can be envisioned, as a complement to the oxides $VO_2$ and $V_nO_{2n+/-1}$.

Preferably, the metal M (or the metals M1, M2, . . . ) is/are selected so that the oxide or oxides of the form $M_{1-x}O_x$ obtained have a transmittance higher than 85% for infrared radiations whose wavelengths are comprised between 6 and 10 µm. Thus, as a complement to the increase in the critical temperature Tc, the formation of a third oxide $M_{1-x}O_x$ makes it possible to increase the partial infrared transmittance of the selective layer at T>Tc and to increase the variation of infrared emissivity as a function of the temperature.

The critical dopant concentration, limit between the atom substitution process and the oxidation process, is a function in particular of the metal M, but also of the material manufacturing method. For example, experience shows that, with the tested manufacturing process and using aluminum as dopant, the critical concentration is 5% atomic aluminum to allow the formation of an aluminum oxide.

Preferably, the metal M selected is aluminum and the oxide having the form $M_{1-x}O_x$ obtained is an aluminum oxide, for example, $Al_2O_3$ (with x=0.6), or an under-stoichiometric aluminum oxide. Among the tests performed, the choice of a 10% concentration of atomic aluminum (10 at. % Al) allows the formation of a layer of the form $VO_2/V_nO_{2n+/-1}/Al_2O_3$ with a critical temperature Tc higher than 80° C., and an infrared emissivity higher than 40% at 150° C. In addition, experience shows that the presence of the new oxide $Al_2O_3$ makes it possible to increase the solar absorption of the selective layer. A measurement of the reflectance between 0.4 and 2.5 µm shows a solar absorption in the order of 83% for a selective layer obtained with aluminum selected as dopant, whereas the selective layers obtained without doping are characterized by a maximum solar absorption of 78 to 79%.

In these conditions, a thermal solar panel whose absorber is produced with a multilayer material comprising a selective layer $VO_2/V_nO_{2n+/-1}/Al_2O_3$ is more effective at low temperature, taking into account a higher solar absorption coefficient, and makes it possible to reduce the stagnation temperature by at least 40° C., as compared to a conventional thermal solar panel (model VITOSOL 200F Viessmann taken as a reference). The stagnation temperature is thus always lower than 160° C. and makes it possible to always ensure the integrity of the heat transfer fluid.

5) Other Variants, Improvements

The multilayer material according to the invention can also comprise, between the selective layer and the support, an adhesive layer, for example, a metallic layer, a layer of oxides, a layer of transition metal nitrides, or a layer of a mixture of these materials, having a thickness comprised between 5 and 100 nm. The adhesive layer improves adhesion of the selective layer on the support.

In the multilayer material according to the invention, the selective layer can also be covered by an antireflection layer having an optical index n3<n2, n2 being the optical index of the selective layer, for radiations whose wavelengths are comprised between 0.4 and 2.5 µm. The antireflection effect thus created makes it possible to increase the global absorbance of the multilayer material from 75-80%(=absorbance of the selective layer) to at least 90%. The antireflection layer has a thickness comprised between 10 and 150 nm. A layer having a thickness higher than 150 nm would result in an undesired degradation of the properties of the material in the infrared range.

Also, in the multilayer material according to the invention, the infrared-reflecting support (wavelengths between 6 and 10 µm) can be:
- a support made up of a single layer of a reflecting material having a reflectance R higher than 80% for radiations of wavelengths higher than 5 µm, for example, an aluminum layer, or
- a support comprising a mechanical support layer made in a weakly infrared-reflecting material covered by an opaque layer having a reflectance higher than 80% for radiations of wavelengths higher than 5 µm.

The invention also relates to a solar panel comprising a multilayer material as described above.

Of course, all the improvements and variants described in points 2, 4, and 5 can be envisioned alone or in combination. Also, point 3 describes an example of a process for producing a selective layer according to the invention, but other known oxidation processes can be envisioned for producing the selective layer.

BRIEF DESCRIPTION OF THE FIGURES

The invention will be better understood, and other features and advantages of the invention will appear, in light of the following description of examples of materials according to the invention. These examples are given as non-limiting examples. The description is to be read in conjunction with the accompanying drawings in which FIG. 1 details the constitution of a multilayer material comprising a selective layer based on pure $VO_2$.

DESCRIPTION OF AN EMBODIMENT OF THE INVENTION

Figure 1:
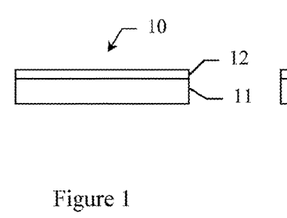

FIG. 1 shows a material 10 comprising a support 11 covered with a layer 12 of pure vanadium oxide $VO_2$. The layer 12 has thermochromic properties and in particular transmittance in the infrared range (wavelengths of between 6 and 10 μm) Tr lower than 10% at T>Tc. The layer 12 is thus almost opaque to infrared radiation at high temperature. The layer 12 has a thickness in the order of 100 to 500 nm.

Figure 2:
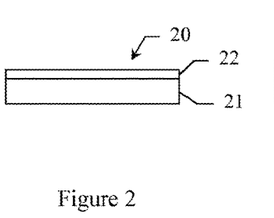
FIGS. 2-4 show the constitution of multi-layer materials according to the invention.

An example of material 20 according to the invention is shown in FIG. 2. It comprises a support 21 and a layer 22 of two-phase material comprising vanadium oxides of the type $VO_2$ and $V_4O_9$, possibly doped with a dopant concentration lower than the critical concentration. The layer 22 has a thickness in the order of 100 to 500 nm.

The supports 11, 21 are made in a material that is opaque and reflects infrareds (reflectance R greater than 80% for radiations of wavelengths greater than 5 μm), and mechanically sufficiently resistant in order to be able to produce a rigid plate of large dimensions (1 to 3 $m^2$ surface area). They are for example made in aluminum (reflectance R>90%), or in a material having sufficient mechanical strength, covered with an opaque layer of aluminum. The optical index n1 and the extinction coefficient k1 of the support are respectively in the order of 5 to 25 and 30 to 86 for wavelengths comprised between 6 and 10 μm.

The layer 12 ($VO_2$) has the following properties:
solar absorbance in the order of 75-80%
infrared transmittance Tr (wavelengths comprised between 6 and 10 μm):
  in the order of 90% when the temperature T is lower than Tc in the order of 65 to 120° C.
  in the order of 5% when the temperature T is higher than Tc
The layer 22 ($VO_2+V_4O_9$) has the following properties:
solar absorbance in the order of 75-80%
infrared transmittance Tr (wavelength comprised between 6 and 10 μm):
  in the order of 90% when the temperature T is lower than Tc in the order of 65 to 120° C.
  in the order of 25 to 35% when the temperature T is higher than Tc
an optical index n2 lower than the optical index n1 of the substrate 21, i.e., in the order of 4 to 6 for wavelengths comprised between 6 and 10 μm.

For low temperatures (T<Tc), the layer 12 is quasi transparent to infrared radiation (transmittance in the order of 90%); thus, the emissivity of the material 10 depends essentially on the emissivity of the support 11; the support 11 being a reflector of infrareds, its infrared emissivity is very low so that the infrared emissivity of the material 10 is very low; therefore, the material 10 has very low thermal losses for temperatures below Tc. In addition, the material 10 has an absorbance equal to that of the layer 12, in the order of 75 to 80%, and thus, a high conversion efficiency of solar energy. The material 20 has the same behavior as the material 10 for T<Tc.

For high temperatures (T>Tc), the layer 12 is quasi opaque to infrared radiation (transmittance lower than 10%); Thus, the emissivity of the material 10 depends essentially on the emissivity of the layer 12, in the order of 25 to 30%. The lowest stagnation temperature of the material 10 is about 180° C.

In contrast, for high temperatures (T>Tc), the layer 22 is partially transparent to infrared radiation (transmittance in the order of 30%); the infrared reflectance of the material 20 is therefore less than that of the material 10 and its infrared emissivity is greater than that of the material 10; in addition, the increase in the path of the infrared radiation in the layer 22 makes it possible to increase the infrared emissivity more at T>Tc. Finally, n2 being lower than n1, the layer 22 can play an antireflection role on the support 21 and reduce the optical reflection of the multilayer material 20 more. In these conditions, the emissivity of the material 20 is higher than 35%, preferably higher than 40%. The material 20 thus heats up much less than the material 10. Tests have shown that the stagnation temperature of the material 20 is, in practice, in the order of 140 to 160° C., and in all cases lower than 170° C.

Figure 3:
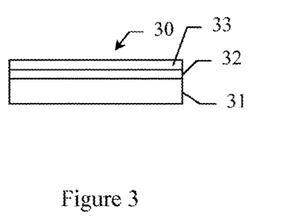
Figure 5:
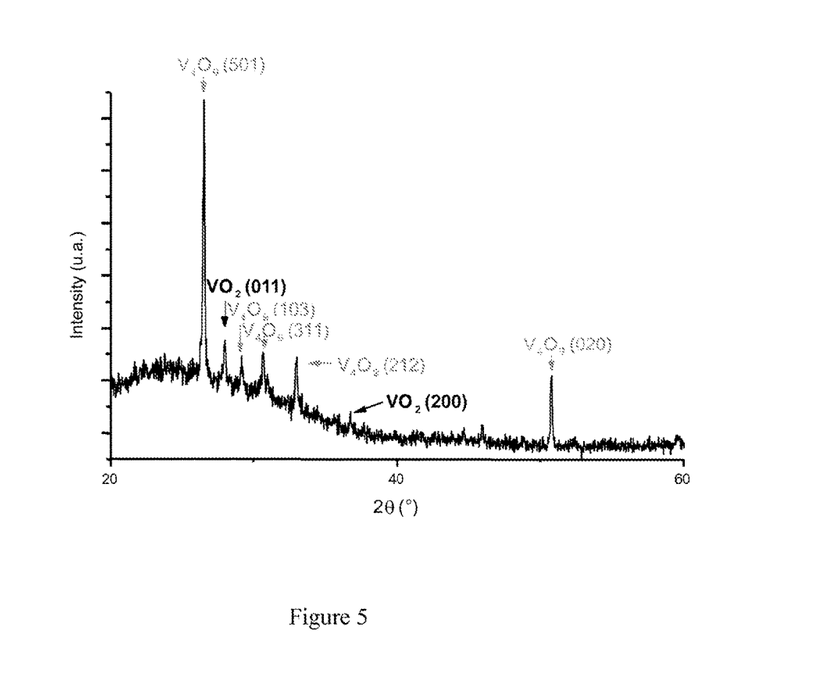
FIG. 5 shows an X-ray diffraction pattern of the layer 32.

FIG. 3 is another example of a material 30 according to the invention. The material 30 comprises a support 31 on which is deposited a selective layer 32 comprising a combination of oxides $VO_2$ and $V_4O_9$, possibly doped with a dopant concentration lower than the critical concentration. FIG. 5 shows by X-ray diffraction the presence of the $VO_2$ and $V_4O_9$ phases with an important proportion of the $V_4O_9$ phase. The layer 32 thus has a partial transmittance comprised between 25 and 30% for wavelengths comprised between 6 and 10 μm. The material 30 comprises, as a complement, an antireflection layer 33 produced in a material such as silicon oxide $SiO_2$, characterized by an optical index n3 close to 1.5 for wavelengths comprised between 0.3 and 2.5 μm. The antireflection layer 33 makes it possible to improve the absorbance of the material 30, which thus reaches more than 90%. The thickness of the layer 33 is adjusted to maximize the antireflection effect in the visible range, which corresponds approximately to the maximum solar emission; to this effect, the thickness of the layer 33 is chosen close to a quarter of the wavelength of the visible radiation divided by n3, i.e., a thickness in the order of 60 nm (380 nm/4/1.5=63 nm), at 130 nm (780 nm/4/1.5=130 nm), for visible radiation at a wavelength comprised between 380 nm and 780 nm.

Figure 6:
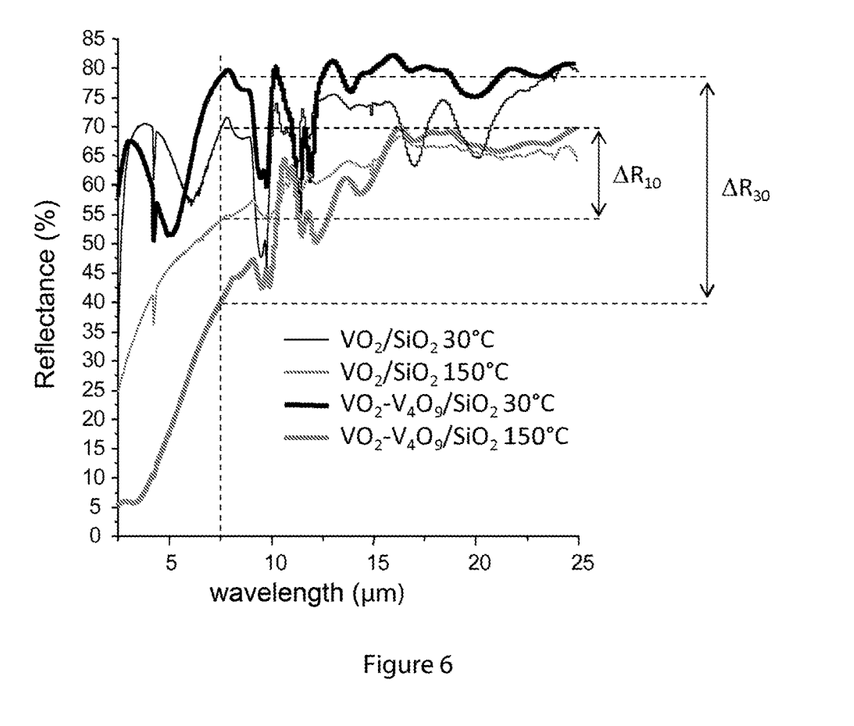
FIG. 6 shows results of measurements made on the material of FIG. 3.

FIG. 6 shows the variation of the reflectance ΔR (reflectance at T>Tc less reflectance at T<Tc), and thus, of the emissivity, as a function of the wavelength, for:

the material 30: Aluminium support/VO$_2$+V$_4$O$_9$ absorbent layer/SiO$_2$ layer the material 10 with an antireflection layer of the same nature and of the same thickness as that deposited on the material 30: Aluminium support/VO$_2$+V$_4$O$_9$ absorbent layer/SiO$_2$ layer It is seen that in the case of the material 30, the variation of the emissivity ΔR$_{30}$ is greater than the variation of the emissivity ΔR$_{10}$ of the material 10. This important variation results in a significant decrease of the stagnation temperature. In addition, and as explained in the description of the invention, the multilayer material according to the invention also has an infrared reflectance at T<Tc greater that a multilayer material in which the selective layer consists of pure VO$_2$. In these conditions, the performance at T<Tc of a solar panel equipped with the multilayer material according to the invention is increased.

Figure 4:
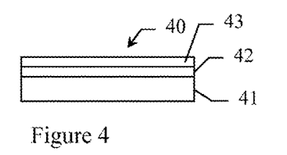

FIG. 4 is another example of a material 40 according to the invention. The material 40 comprises a support 41 on which is deposited a selective layer 42 comprising a combination of oxides VO$_2$, V$_4$O$_9$, and Al$_2$O$_3$ (obtained by doping with an aluminum atomic concentration of 10%, i.e., higher than the critical concentration), covered by an antireflection layer 43. The material 40 has a solar absorption between 0.4 and 2.5 μm higher than 94% as well as an infrared emissivity measured at 8 μm varying between 5 and 45% as a function of the temperature.

Figure 7:
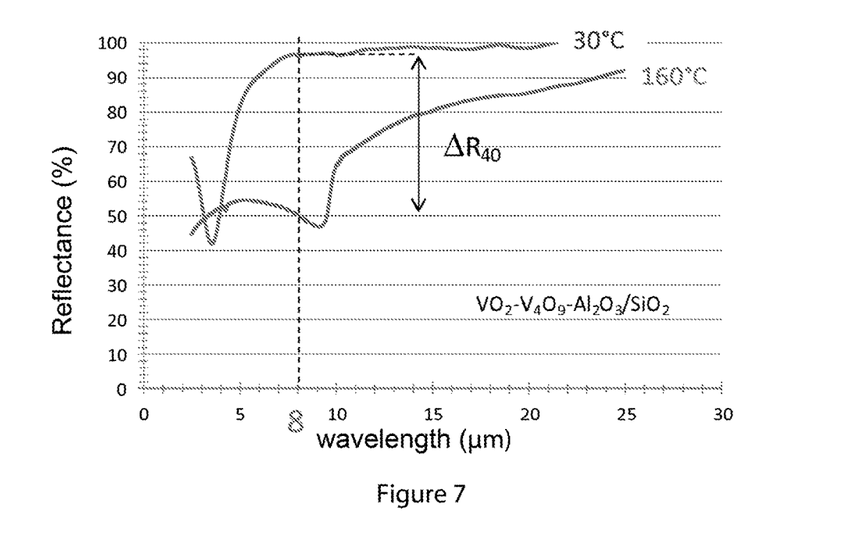
FIG. 7 shows results of measurements made on the material of FIG. 4.

FIG. 7 shows the variation of the reflectance ΔR (reflectance at T>Tc less reflectance at T<Tc), and thus, of the emissivity, as a function of the wavelength, for the material 40, and shows a variation of the emissivity ΔR$_{40}$ that is improved even more as compared to the material 30. That is, whereas ΔR$_{30}$ is in the order of 38%, ΔR$_{40}$ reaches about 46% for a wavelength in the order of 8 μm. FIG. 7 also shows a better behavior of the material 40 at low temperature with a reflection coefficient at 8 μm in the order of 96% (i.e., emissivity close to 4%).

In these conditions, a thermal solar cell equipped with the material 40 according to the invention operates, at T<Tc, with Tc>80° C., identically to a standard thermal solar cell, with a solar absorption of 94% and an infrared emissivity of 5%, and in addition, makes it possible, at T>Tc, to reduce considerably the stagnation temperature to a value lower than 160° C.

The invention claimed is:

1. A multilayer material comprising at least:
   a support having a reflectivity R higher than 80% for radiations of wavelengths higher than 5 μm,
   a selective layer having a thickness comprised between 100 and 500 nm, said selective layer comprising a combination of vanadium oxides VO$_2$ and V$_n$O$_{2n+/-1}$, with n>1, said selective layer having an absorbance higher than 75% for radiations of wavelengths comprised between 0.4 and 2.5 μm, regardless of the temperature T, and having, for radiations of wavelengths comprised between 6 and 10 μm, a transmittance Tr such that:
   Tr>85% for T<Tc, a critical temperature,
   20%≤Tr≤50% for T>Tc,
   wherein, for radiations of wavelengths comprised between 6 and 10 μm, the support has an optical index n1 and the selective layer has an optical index n2 such that:
   n2<n1 regardless of the temperature T, and
   n2<6 T>Tc.

2. Material according to claim 1, wherein the selective layer has an extinction coefficient k lower than 4 for radiations of wavelengths comprised between 6 and 10 μm.

3. Material according to claim 1, wherein, for radiations of wavelengths between 6 and 10 μm, the optical index n2 is comprised between 0.8*(n1)$^{1/2}$ and 1.2*(n1)$^{1/2}$ for T>Tc.

4. Material according to claim 1, wherein the selective layer has a thickness comprised between 100 and 200 nm.

5. Material according to claim 1, wherein the selective layer is doped with at least one metal M different from Vanadium.

6. Material according to claim 5, wherein the selective layer is doped with aluminum and has a critical temperature comprised between 80° C. and 120° C.

7. Material according to claim 5, wherein the selective layer has a concentration in the dopant M sufficient to form at least one oxide of the form M$_{1-x}$O$_x$, with 0<x<1, x being the atomic fraction of oxygen in the oxide, so that the selective layer comprises a combination of oxides of the type VO$_2$, V$_n$O$_{2n+/-1}$, and M$_{1-x}$O$_x$.

8. Material according to claim 7, wherein the oxide or oxides in the form M$_{1-x}$O$_x$ have a transmittance higher than 85% for infrared radiations whose wavelengths are comprised between 6 and 10 μm.

9. Material according to claim 8, wherein the oxide of the form M$_{1-x}$O$_x$ is an aluminum oxide.

10. Material according to claim 1, wherein the selective layer is covered with an antireflection layer having, for radiations whose wavelengths are comprised between 0.4 and 2.5 μm, an optical index n3<n2, n2 being the optical index of the selective layer.

11. Material according to claim 10, wherein the antireflective layer has a thickness comprised between 10 and 150 nm.

12. Material according to claim 1, further comprising, between the selective layer and the support, an adhesive layer, for example, a metal layer, an oxide layer, a layer of transition metal nitrides, or a layer of a mixture of these materials, having a thickness comprised between 5 and 100 nm.

13. Material according to claim 1, wherein the selective layer comprises:
   a combination of VO$_2$ and V$_4$O$_9$ Vanadium oxides, or
   a combination of VO$_2$ and V$_6$O$_{13}$ Vanadium oxides, or
   a combination of VO$_2$ and V$_4$O$_9$ Vanadium oxides and Al$_2$O$_3$ oxide.

14. Solar panel comprising a multilayer material according to claim 1.

15. Material according to claim 2, wherein, for radiations of wavelengths between 6 and 10 μm, the optical index n2 is comprised between 0.8*(n1)$^{1/2}$ and 1.2*(n1)$^{1/2}$ for T>Tc.

16. Material according to claim 5, wherein the at least one metal M is aluminum, chromium, or titanium.

17. Material according to claim 8, wherein the oxide of the form M$_{1-x}$O$_x$ is Al$_2$O$_3$.

18. Material according to claim 8, wherein the oxide of the form M$_{1-x}$O$_x$ is an under-stoichiometric aluminum oxide.

19. A multilayer material comprising at least:
   a support having a reflectivity R higher than 80% for radiations of wavelengths higher than 5 μm,
   a selective layer having a thickness comprised between 100 and 500 nm, said selective layer comprising a combination of vanadium oxides VO$_2$ and V$_n$O$_{2n+/-1}$, with n>1, said selective layer having an absorbance higher than 75% for radiations of wavelengths comprised between 0.4 and 2.5 μm, regardless of the temperature T, and having, for radiations of wavelengths comprised between 6 and 10 μm, a transmittance Tr such that:
Tr>85% for T<Tc, a critical temperature,
20%≤Tr≤50% for T>Tc,
wherein the selective layer is covered with an antireflection layer having, for radiations whose wavelengths are comprised between 0.4 and 2.5 μm, an optical index n3<n2, n2 being the optical index of the selective layer.

20. Material according to claim 19, wherein the antireflective layer has a thickness comprised between 10 and 150 nm.

* * * * *